United States Patent
Moon et al.

(10) Patent No.: US 9,660,172 B2
(45) Date of Patent: May 23, 2017

(54) VIBRATOR

(71) Applicant: SAMSUNG ELECTRO-MECHANICS CO., LTD., Suwon-Si (KR)

(72) Inventors: Dong Su Moon, Suwon-Si (KR); Sang Jin Lee, Suwon-Si (KR); Jae Kyung Kim, Suwon-Si (KR); Kyung Su Park, Suwon-Si (KR); Joon Choi, Suwon-Si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 384 days.

(21) Appl. No.: 14/550,819

(22) Filed: Nov. 21, 2014

(65) Prior Publication Data

US 2015/0188027 A1 Jul. 2, 2015

(30) Foreign Application Priority Data

Dec. 30, 2013 (KR) .................. 10-2013-0167536

(51) Int. Cl.
| | |
|---|---|
| *H01L 41/09* | (2006.01) |
| *H01L 41/047* | (2006.01) |
| *H01L 41/053* | (2006.01) |
| *B06B 1/06* | (2006.01) |
| *B06B 1/14* | (2006.01) |

(52) U.S. Cl.
CPC ........ *H01L 41/0475* (2013.01); *B06B 1/0603* (2013.01); *B06B 1/14* (2013.01); *H01L 41/053* (2013.01); *H01L 41/0933* (2013.01)

(58) Field of Classification Search
CPC . H01L 41/0475; H01L 41/053; B06B 1/0603; B06B 1/14

USPC ................................. 310/323.02, 323.01
See application file for complete search history.

(56) References Cited

U.S. PATENT DOCUMENTS

| | | | | |
|---|---|---|---|---|
| 7,969,065 B2* | 6/2011 | Seki | ................ | H02N 2/004 310/323.02 |
| 8,643,252 B2* | 2/2014 | Oda | ................ | H02N 2/0015 310/323.02 |
| 2012/0194035 A1* | 8/2012 | Jacob | ................ | G01F 23/2968 310/321 |
| 2012/0212100 A1* | 8/2012 | Lee | ................ | H01L 41/053 310/317 |

(Continued)

FOREIGN PATENT DOCUMENTS

| | | |
|---|---|---|
| JP | 2008-211863 A | 9/2008 |
| KR | 10-2007-0019332 A | 2/2007 |

(Continued)

OTHER PUBLICATIONS

English Translation of KP 1020120037191, Kim.*

*Primary Examiner* — Bryan Gordon
(74) *Attorney, Agent, or Firm* — LRK Patent Law Firm

(57) ABSTRACT

There is provided a vibrator including: an elastic member of which both end portions are fixedly attached to a housing; a piezoelectric element installed on one surface of the elastic member; and a circuit board attached to the elastic member to be connected to the piezoelectric element, wherein an opening portion for a connection between the piezoelectric element and the circuit board is provided in the elastic member, and a step portion insertedly disposed in the opening portion is formed at the circuit board.

10 Claims, 6 Drawing Sheets

(56) References Cited

U.S. PATENT DOCUMENTS

2013/0140918 A1* 6/2013 Choi .................. H02K 33/18
                                                310/25
2013/0214648 A1* 8/2013 Yamada ............ H03H 9/02157
                                                310/366
2013/0334932 A1* 12/2013 Maruyama ........... H01L 41/053
                                                310/348

FOREIGN PATENT DOCUMENTS

| KR | 10-2008-0042560 A | 5/2008 |
| KR | 10-2011-0045486 A | 4/2011 |
| KR | 10-1157868 B1 | 6/2012 |

* cited by examiner

VIBRATOR

CROSS-REFERENCE TO RELATED APPLICATION

This application claims the priority and benefit of Korean Patent Application No. 10-2013-0167536 filed on Dec. 30, 2013, with the Korean Intellectual Property Office, the disclosure of which is incorporated herein by reference.

BACKGROUND

The present disclosure relates to a vibrator.

A vibrator, a device converting electrical energy into mechanical vibrations through the generation of electromagnetic force, is mounted in a mobile phone, or the like, to be used for silently notifying a user of call reception. In addition, as the market for mobile devices such as a mobile phones and the like has rapidly expanded, and various functions have been added to such mobile devices, mobile devices having small sizes and high quality have been demanded. In this situation, the need to develop vibrators having new structures, capable of overcoming the disadvantages of existing products, and having significantly improved quality has also increased.

Further, as the release of smartphones, among mobile phones, has rapidly increased, a touchscreen scheme has been adopted, such that adoption of a vibration motor has been increased in order to generate vibration at the time of touching the smartphones. Performance particularly required in the vibration at the time of the touch of a touchscreen is as follows. First, as the amounts of vibrations generated in devices, in response to touches, has increased to be greater than vibrations generated at the time of call reception, an operational lifespan of vibrators needs to be increased. Second, in order to increase user satisfaction when a user experiences vibrations in response to a touch, vibration response speeds need to be increased in accordance with a touch speed of the screen.

As a product capable of implementing the characteristics as described above, there is provided a piezoelectric haptic actuator. Such a piezoelectric haptic actuator uses the principle of a converse piezoelectric effect, in which displacement of a piezoelectric element is generated when a voltage is applied thereto, and vibratory force is generated by allowing a mass body of a mover to move by the generated displacement.

A vibrator having this structure may be characterized in that a frequency band width capable of obtaining a predetermined level of vibratory force or more is wider, such that stable vibrational characteristics may be implemented, and vibrations having a low or high frequency, rather than a single frequency, may be variously used within a predetermined frequency range. In addition, since rapid operational response characteristics may be implemented with the use thereof, the piezo haptic actuator may be suitable for implementing haptic vibrations in mobile devices such as mobile phones, and the like.

Meanwhile, a circuit board may be installed on the piezoelectric element, and external power is supplied to the piezoelectric element through the circuit board. However, in the case in which the piezoelectric element is installed on an elastic plate, the circuit board should be installed on a surface opposite to the surface on which the piezoelectric element is installed.

In this case, it may not be easy to connect the circuit board and the piezoelectric element to one another. Further, during driving of the piezoelectric element or in the case that an the shock of an external impact is transferred thereto, solder used for coupling the circuit board and the piezoelectric element to each other may be detached, or the circuit board and the piezoelectric element may be separated from each other.

RELATED ART DOCUMENT (Patent Document 1) Korean Patent Laid-Open Publication No. 2011-45486

SUMMARY

An aspect of the present disclosure may provide a vibrator capable of decreasing damage to a circuit board and the occurrence of separation of the circuit board and a piezoelectric element.

According to an aspect of the present disclosure, a vibrator may include: an elastic member of which both end portions are fixedly attached to a housing; a piezoelectric element installed on one surface of the elastic member; and a circuit board attached to the elastic member to be connected to the piezoelectric element, wherein an opening portion for a connection between the piezoelectric element and the circuit board is provided in the elastic member, and a step portion insertedly disposed in the opening portion is formed at the circuit board.

A connection electrode for forming an electric connection with the piezoelectric element may be formed on the step portion.

At least one pair of external electrodes may be formed on the piezoelectric element.

The opening portion may have a rectangular shape when viewed from above, and the step portion may have a shape corresponding to the opening portion to be insertedly disposed in the opening portion.

The vibrator may further include a mass body part disposed on the piezoelectric element to increase a degree of vibrations of the elastic member.

The weight body part may include a mass body case connected to the piezoelectric element via an adhesive member, and a mass body installed in the mass body case.

The connection electrode may include a first connection electrode connected to a first external electrode formed at one end portion of a bottom surface of the piezoelectric element and a second connection electrode connected to a second external electrode formed at the other end portion of the bottom surface of the piezoelectric element.

The circuit board may be formed of a flexible printed circuit board (FPCB).

The housing may include an upper case having an internal space and an open lower end portion and a lower case attached to the upper case and having a support part supporting both end portions of the elastic member.

According to another aspect of the present disclosure, a vibrator may include: an upper case having an internal space and an open lower end portion; a lower case attached to the upper case and including a support part provided at both end portions thereof; an elastic member having both end portions supported by the support part and having an opening portion; a piezoelectric element installed on one surface of the elastic member; and a circuit board attached to the elastic member to be connected to the piezoelectric element, and having a step portion formed to be insertedly disposed in the opening portion, wherein the circuit board is formed of a flexible printed circuit board.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
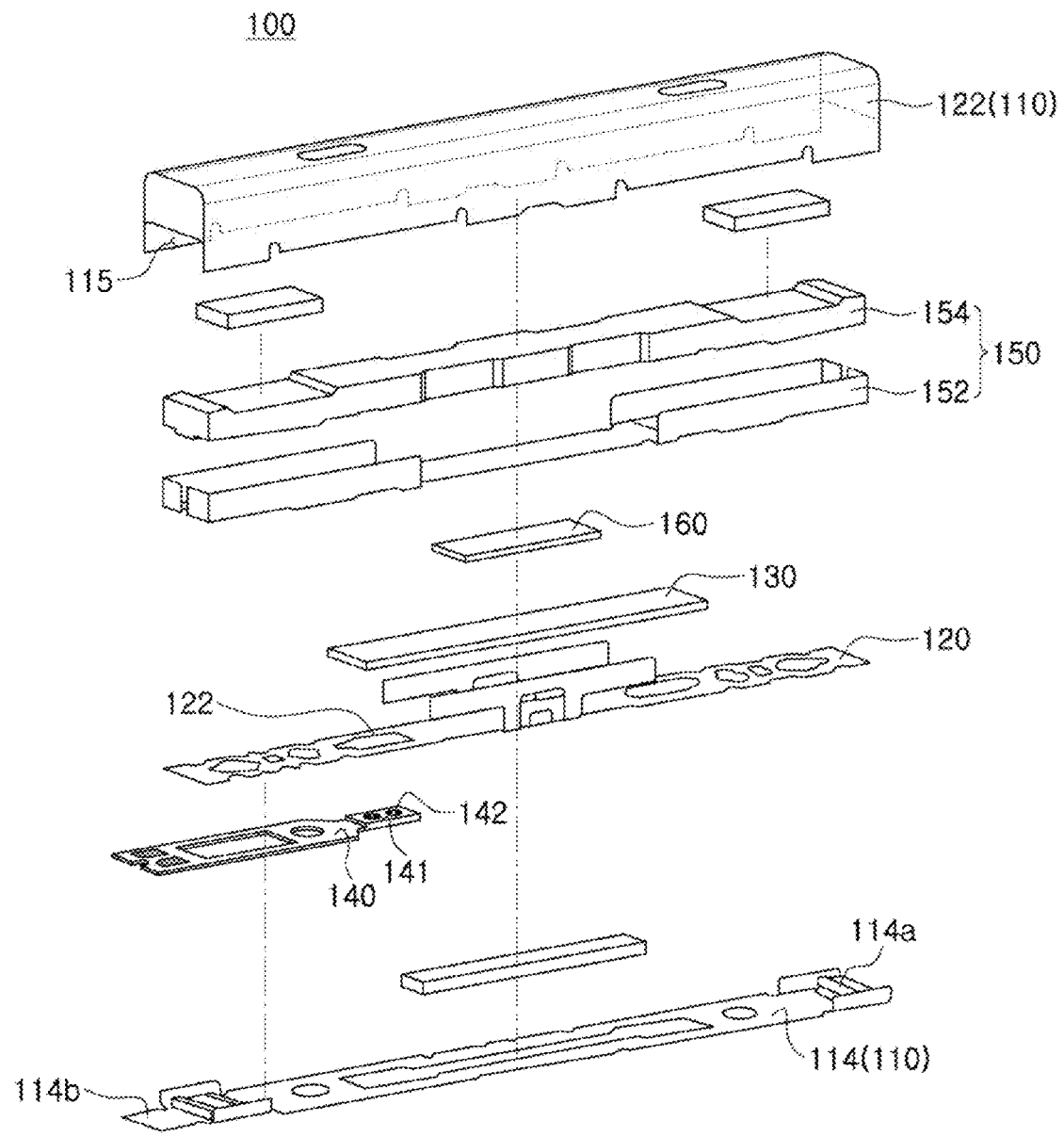
FIG. 1 is an exploded perspective view illustrating a vibrator according to an exemplary embodiment of the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
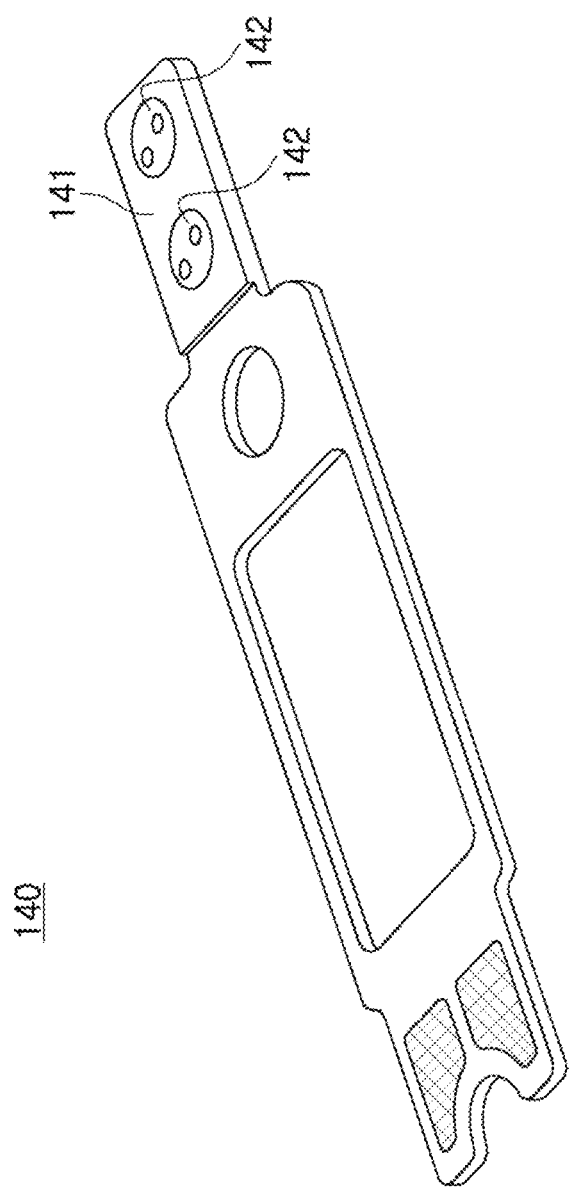
FIG. 2 is a perspective view illustrating a circuit board provided in the vibrator according to an exemplary embodiment of the present disclosure.
Figure 3:
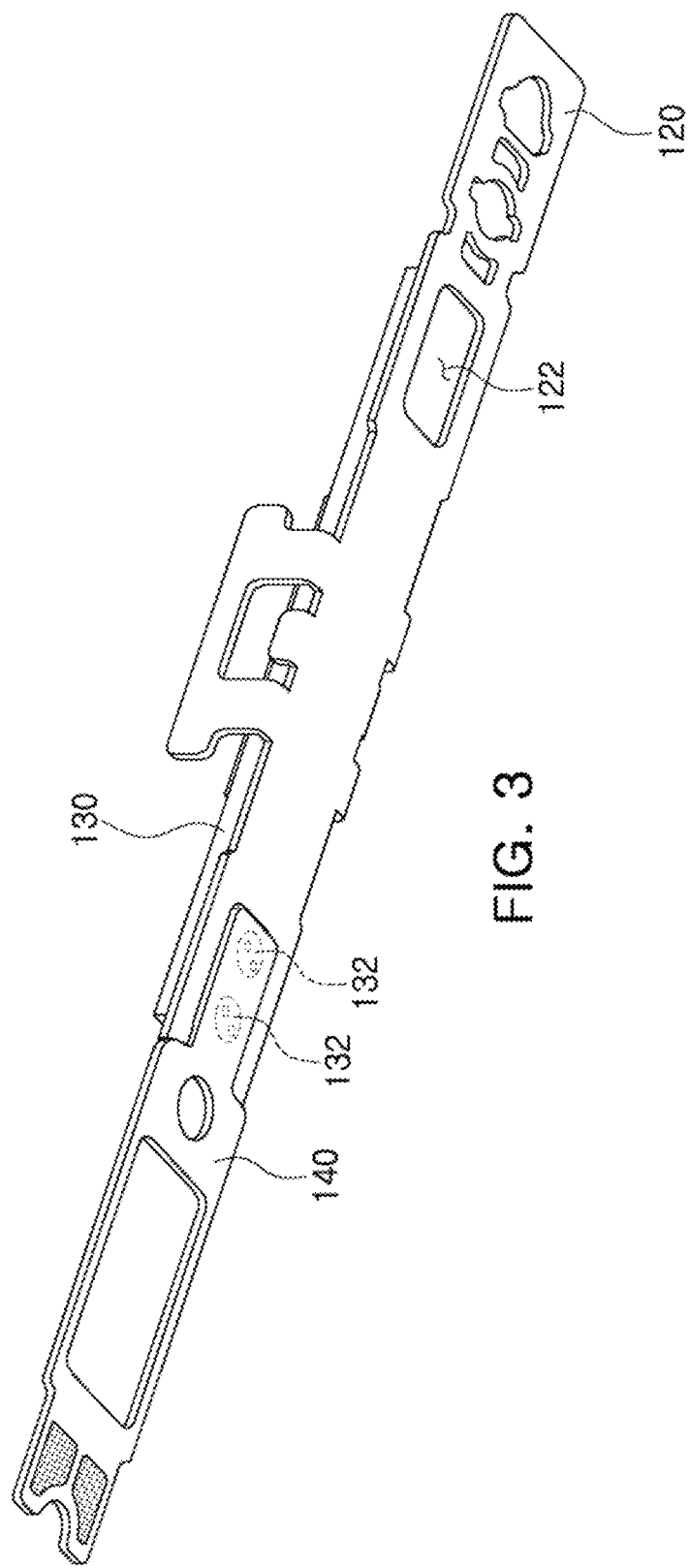
FIG. 3 is a view illustrating an assembly state of the circuit board and a piezoelectric element provided in the vibrator according to an exemplary embodiment of the present disclosure.

FIG. 1 is an exploded perspective view illustrating a vibrator according to an exemplary embodiment of the present disclosure, FIG. 2 is a perspective view illustrating a circuit board provided in the vibrator according to an exemplary embodiment of the present disclosure, and FIG. 3 is a view illustrating an assembly state of the circuit board and a piezoelectric element provided in the vibrator according to an exemplary embodiment of the present disclosure.

Referring to FIGS. 1 through 3, a vibrator 100 according to an exemplary embodiment of the present disclosure may include, for example, a housing 110, an elastic member 120, a piezoelectric element 130, a circuit board 140, and a mass body part 150.

The housing 110 may have a rectangular parallelepiped shape and include upper and lower cases 112 and 114. In addition, as an example, the upper case 112 may have a box shape having an internal space, and the lower case 114 may have a plate shape.

Meanwhile, the upper case 112 has a box shape in which a lower portion thereof is open, and the lower case 114 having the plate shape may be assembled to a lower end part of the upper case 112.

In addition, a groove for leading the circuit board 140 may be formed in at least one of both end surfaces of the upper case 112. That is, one end portion of the circuit board 140 may be led through the groove 115 formed in the upper case 112 at the time of assembling the upper and lower cases 112 and 114.

A support part 114a for supporting both end portions of the elastic member 120 may be formed in the lower case 114. As an example, the support part 114a may be formed by denting and have a square pillar shape.

In addition, an extension plate 114b extended so as to protrude from the upper case 112 in a length direction may be formed at any one of both end portions of the lower case 114. The extension plate 114b may provide a seating surface on which a portion of the circuit board 140, led out at the time of leading the circuit board 140, is seated.

The elastic member 120 has both end portions fixedly attached to the housing 110. Therefore, the elastic member 120 may have fixed ends formed at both end portions thereof. However, although the case in which the elastic member 120 is fixedly attached to the lower case 114 is described in the present exemplary embodiment, the present disclosure is not limited thereto. That is, the elastic member 120 may also be attached to the upper case 112.

Meanwhile, an opening portion 122 for electrically connecting the piezoelectric element 130 and the circuit board 140 may be formed in the elastic member 120. The opening portion 122 may be formed in the elastic member 120 so that one end portion of a bottom surface of the piezoelectric element 130 may be exposed at the time of installing the piezoelectric element 130.

That is, one end portion of the bottom surface of the piezoelectric element 130 may be exposed toward a lower portion of the elastic member 120 by the opening portion 122.

In addition, as an example, the opening portion 122 may have a rectangular shape when viewed from above. However, the present disclosure is not limited thereto, but the shape of the opening portion 122 may be variously changed.

The piezoelectric element 130 may be installed on the elastic member 120 so as to face the mass body part 150. As an example, the piezoelectric element 130 may be fixedly attached to an upper surface of the elastic member 120. In addition, the piezoelectric element 130 may have a rectangular parallelepiped plate shape, and at least one pair of external electrodes 132 may be provided on the bottom surface of the piezoelectric element 130. The pair of external electrodes 132 may be composed of a positive (+) electrode and a negative (−) electrode.

However, the case in which a pair of external electrodes are formed at one end portion of the bottom surface of the piezoelectric element 130 is described by way of example in the present exemplary embodiment, but the present disclosure is not limited thereto.

The circuit board 140 may be attached to the elastic member 120 to be connected to the piezoelectric element 130. That is, the circuit board 140 may be installed on the bottom surface of the elastic member 120. In addition, a step portion 141 insertedly disposed in the opening portion 122 formed in the elastic member 120 may be formed at the circuit board 140. Further, the step portion 141 may have a shape corresponding to the opening portion 122. For example, the step portion 141 may have a rectangular shape when viewed from above.

A connection electrode 142 for forming an electric connection with the piezoelectric element 130 may be formed on the step portion 141. As described above, the step portion 141 is insertedly disposed in the opening portion 122 of the elastic member 120, such that the circuit board 140 may not be bent.

In other words, in the case in which the step portion 141 is not formed at the circuit board 140, a portion of the circuit board 140 on which the connection electrode 142 is formed needs to be bent to thereby be insertedly disposed in the opening portion 122 of the elastic member 120 to form an electrical connection between the connection electrode 142 of the circuit board 140 and the external electrode 132 of the piezoelectric element 130. In this case, the circuit board 140 is bent, such that the connection electrode 142 and the external electrode 132 may be connected to each other.

Therefore, a solder between the connection electrode 142 and the external electrode 132 may be detached at the time of operation or external impact, and the circuit board 140 and the piezoelectric element 130 may even be separated from each other.

However, as described above, the step portion 141 is insertedly disposed in the opening portion 122, such that the circuit board 140 and the piezoelectric element 130 may be connected to each other without bending the circuit board 140.

Therefore, at the time of operation or external impact, detachment of the solder between the connection electrode 142 and the external electrode 132 or separation of the circuit board 140 and the piezoelectric element 130 may be prevented. Further, at the time of assembling the circuit board 140, dislocation of an assembly position may be prevented, such that a manufacturing yield may be improved.

Meanwhile, the circuit board 140 may be formed of a flexible printed circuit board (FPCB).

The mass body part 150 may be disposed on the piezoelectric element 130 to increase a degree of vibrations of the elastic member 120. Meanwhile, the mass body part 150 may include a mass body case 152 connected to the piezoelectric element 130 by an adhesive member 160 and a mass body 154 installed in the mass body case 152.

The mass body 154 may be insertedly disposed in the mass body case 152, and connected to the piezoelectric element 130 through the adhesive member 160 on a bottom surface thereof.

In addition, the mass body 154 may be formed of a material having a large specific gravity, for example, tungsten, and serve to amplify the degree of vibrations generated by deformation of the piezoelectric element 130. Further, the mass body 154 may have a shape corresponding to the mass body case 152 to be installed in the mass body case 152.

Meanwhile, shapes of the mass body case 152 and the mass body 154 are not limited to shapes shown in the accompanying drawings but may be variously changed.

As described above, the step portion 141 is insertedly disposed in the opening portion 122, such that the circuit board 140 and the piezoelectric element 130 may be connected to each other without bending the circuit board 140.

Therefore, at the time of operation or external impact, detachment of the solder between the connection electrode 142 and the external electrode 132, or separation of the circuit board 140 and the piezoelectric element 130 may be prevented. Further, at the time of assembling the circuit board 140, dislocation of an assembly position may be prevented, such that a manufacturing yield may be improved.

Hereinafter, a vibrator according to another exemplary embodiment of the present disclosure will be described with reference to the accompanying drawings. However, the same reference numerals will be used to describe the same components as the above-mentioned components, and a description thereof will be replaced with the above-mentioned description.

Figure 4:
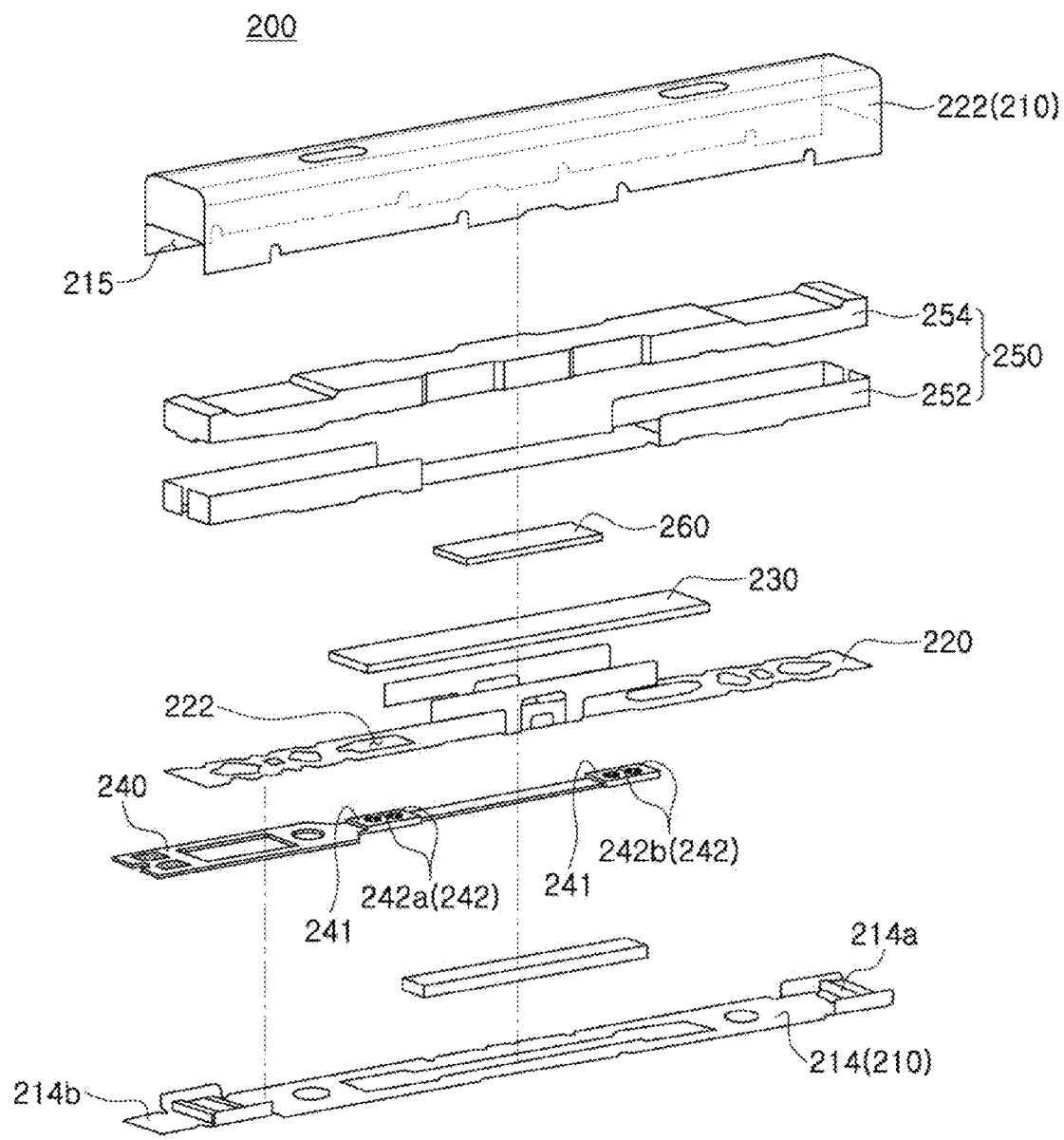
FIG. 4 is an exploded perspective view illustrating a vibrator according to another exemplary embodiment of the present disclosure.
Figure 5:
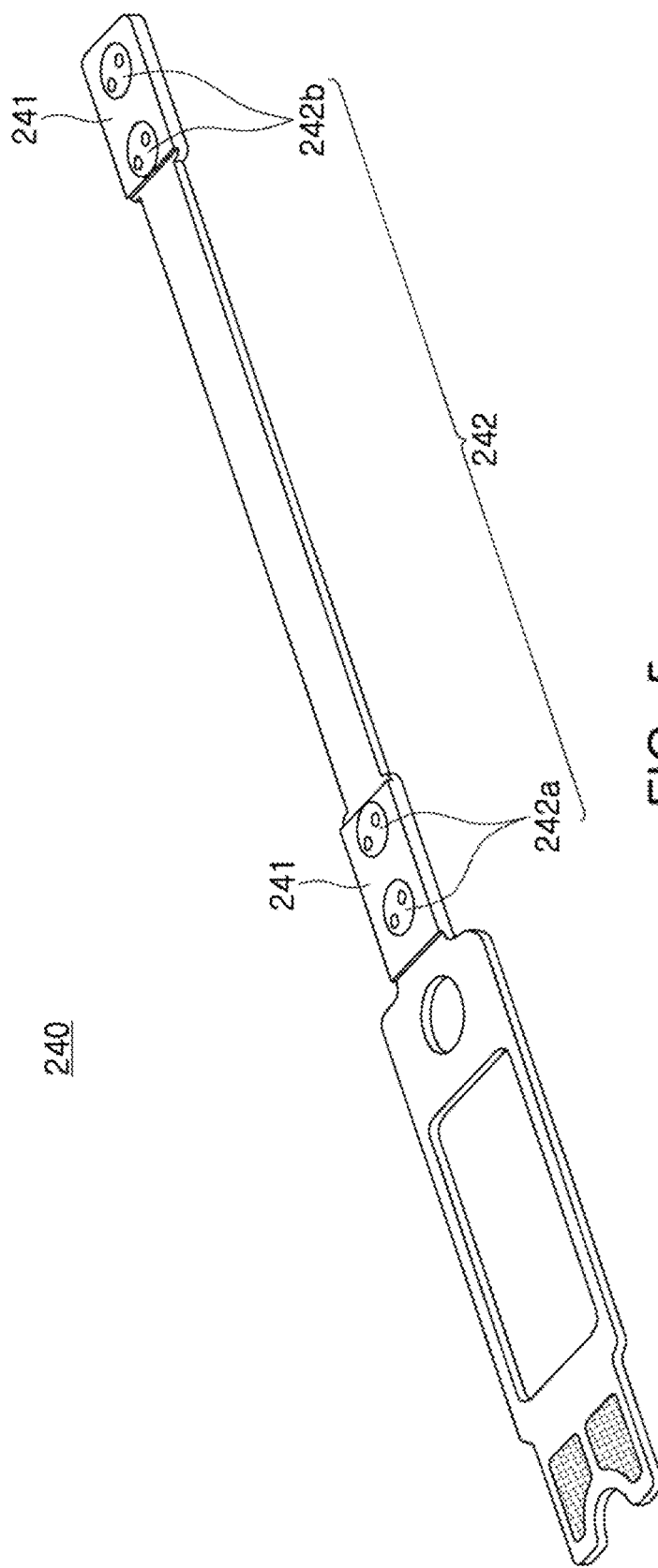
FIG. 5 is a perspective view illustrating a circuit board provided in the vibrator according to another exemplary embodiment of the present disclosure.
Figure 6:
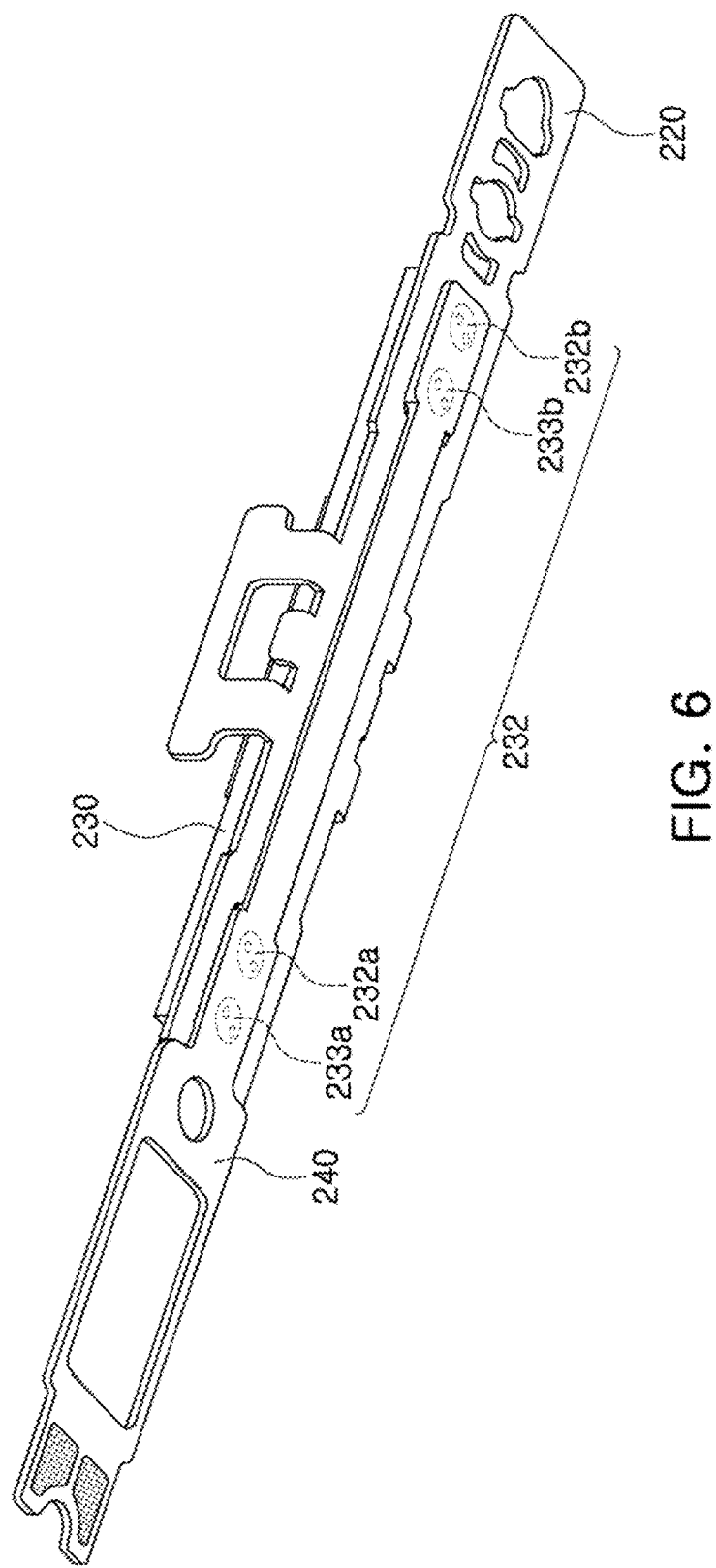
FIG. 6 is a view illustrating an assembly state of the circuit board and a piezoelectric element provided in the vibrator according to another exemplary embodiment of the present disclosure.

FIG. 4 is an exploded perspective view illustrating a vibrator according to another exemplary embodiment of the present disclosure, FIG. 5 is a perspective view illustrating a circuit board provided in the vibrator according to another exemplary embodiment of the present disclosure, and FIG. 6 is a view illustrating an assembly state of the circuit board and a piezoelectric element provided in the vibrator according to another exemplary embodiment of the present disclosure.

Referring to FIGS. 4 through 6, a vibrator 200 according to another exemplary embodiment of the present disclosure may include, for example, a housing 110, an elastic member 220, a piezoelectric element 230, a circuit board 240, and a mass body part 150.

Meanwhile, the housing 110 and the mass body part 150 correspond to the same components as components described in the vibrator 100 according to an exemplary embodiment of the present disclosure, a detailed description thereof will be omitted and replaced with the above-mentioned description.

The elastic member 220 has both end portions fixedly attached to the housing 110. Therefore, the elastic member 220 may have fixed ends formed at both end portions thereof.

Meanwhile, an opening portion 222 for electrically connecting the piezoelectric element 130 and the circuit board 240 may be formed in the elastic member 220. The opening portion 222 may be formed in the elastic member 120 so that both end portions of a bottom surface of the piezoelectric element 130 may be exposed at the time of installing the piezoelectric element 130.

That is, two opening portions 222 are formed in the elastic member 220, such that both end portions of the bottom surface of the piezoelectric element 130 may be exposed toward a lower portion of the elastic member 120 by the opening portion 222.

In addition, as an example, the opening portion 222 may have a rectangular shape when viewed from above. However, the present disclosure is not limited thereto, but the shape of the opening portion 222 may be variously changed.

The piezoelectric element 230 may be installed on the elastic member 220 so as to face the mass body part 150. As an example, the piezoelectric element 230 may be fixedly attached to an upper surface of the elastic member 220. In addition, the piezoelectric element 230 may have a rectangular parallelepiped plate shape, and a pair of external electrodes 232 may be provided on each of both end portions of the bottom surface of the piezoelectric element 230. In other word, two pairs of external electrodes may be formed on both end portions of the bottom surface of the piezoelectric element 230.

As an example, a pair of first external electrodes 232a may be formed on one end portion of the bottom surface of the piezoelectric element 230, and a pair of second external electrodes 232b may be formed on the other end portion of the bottom surface of the piezoelectric element 230, such that the external electrode 232 may be composed of the first and second external electrodes 232a and 232b.

The circuit board 240 may be attached to the elastic member 220 to be connected to the piezoelectric element 130. That is, the circuit board 240 may be installed on the bottom surface of the elastic member 220. In addition, a step portion 241 insertedly disposed in the opening portion 222 formed in the elastic member 220 may be formed at the circuit board 240. Further, the step portion 241 may have a shape corresponding to the opening portion 222. For example, the step portion 241 may have a rectangular shape when viewed from above. In addition, two step portions 241 may be formed so as to correspond to two opening portions 222.

A connection electrode 242 for forming an electrical connection with the piezoelectric element 230 may be formed on the step portion 241. In addition, the connection electrode 242 may be composed of a first connection electrode 242a connected to the first external electrode 232a and a second connection electrode 242b connected to the second external electrode 232b.

As described above, the step portion 241 is insertedly disposed in the opening portion 222 of the elastic member 220, such that the circuit board 240 may not be bent.

In other words, in the case in which the step portion 241 is not formed at the circuit board 240, a portion of the circuit board 240 on which the connection electrode 242 is formed needs to be bent to thereby be insertedly disposed in the opening portion 222 of the elastic member 220 to form an electrical connection between the connection electrode 242 of the circuit board 240 and the external electrode 232 of the piezoelectric element 230. In this case, the circuit board 240 is bent, such that the connection electrode 242 and the external electrode 232 may be connected to each other.

Therefore, a solder between the connection electrode 242 and the external electrode 232 may be detached at the time of operation or external impact, and the circuit board 240 and the piezoelectric element 230 may even be separated from each other.

However, as described above, the step portion 241 is insertedly disposed in the opening portion 222, such that the circuit board 240 and the piezoelectric element 230 may be connected to each other without bending the circuit board 240.

Therefore, at the time of operation or external impact, detachment of the solder between the connection electrode 242 and the external electrode 232, or separation of the circuit board 240 and the piezoelectric element 230 may be prevented. Further, at the time of assembling the circuit board 240, dislocation of an assembly position may be prevented, such that a manufacturing yield may be improved.

Meanwhile, the circuit board 240 may be formed of a flexible printed circuit board (FPCB).

As set forth above, according to exemplary embodiments of the present disclosure, the damage of the circuit board and separation of the circuit board and the piezoelectric element may be decreased through the step portion.

While exemplary embodiments have been shown and described above, it will be apparent to those skilled in the art that modifications and variations could be made without departing from the scope of the present invention as defined by the appended claims.

What is claimed is:

1. A vibrator comprising:
   an elastic member of which both end portions are fixedly attached to a housing;
   a piezoelectric element installed on one surface of the elastic member; and
   a circuit board installed on another surface of the elastic member, which is opposite to the one surface of the elastic member,
   wherein the elastic member includes an opening portion through which the piezoelectric element and the circuit board are connected to each other, and
   wherein the circuit board includes a step portion which is formed to be inserted to the opening portion of the elastic member.

2. The vibrator of claim 1, wherein the circuit board further includes a connection electrode which is formed on the step portion to make an electric connection with the piezoelectric element.

3. The vibrator of claim 1, wherein the piezoelectric element includes at least one pair of external electrodes.

4. The vibrator of claim 1, wherein the opening portion has a rectangular shape when viewed from above, and the step portion has a shape corresponding to the opening portion so that the step portion can be inserted to the opening portion.

5. The vibrator of claim 1, further comprising a mass body part disposed on the piezoelectric element to increase a degree of vibrations of the elastic member.

6. The vibrator of claim 5, wherein the mass body part includes a mass body case connected to the piezoelectric element via an adhesive member, and a mass body installed in the mass body case.

7. The vibrator of claim 2, wherein the connection electrode includes:
   a first connection electrode connected to a first external electrode formed at one end portion of a bottom surface of the piezoelectric element; and
   a second connection electrode connected to a second external electrode formed at the other end portion of the bottom surface of the piezoelectric element.

8. The vibrator of claim 1, wherein the circuit board is formed of a flexible printed circuit board (FPCB).

9. The vibrator of claim 1, wherein the housing includes:
   an upper case having an internal space and an open lower end portion; and
   a lower case attached to the upper case and having a support part supporting both end portions of the elastic member.

10. A vibrator comprising:
    an upper case having an internal space and an open lower end portion;
    a lower case attached to the upper case and including a support part provided at both end portions thereof;
    an elastic member of which both end portions are supported by the support part and which includes an opening portion;
    a piezoelectric element installed on one surface of the elastic member; and
    a circuit board installed on another surface of the elastic member and including a step portion which is formed to be inserted to the opening portion of the elastic member,
    wherein the circuit board is formed of a flexible printed circuit board.

* * * * *